(12) United States Patent
Toyoda et al.

(10) Patent No.: US 12,349,328 B2
(45) Date of Patent: Jul. 1, 2025

(54) ELECTRIC-WAVE ABSORBER AND MANUFACTURING METHOD FOR ELECTRIC-WAVE ABSORBER

(71) Applicant: Maxell, Ltd., Kyoto (JP)

(72) Inventors: Masayuki Toyoda, Kyoto (JP); Masao Fujita, Kyoto (JP)

(73) Assignee: MAXELL, LTD., Kyoto (JP)

( * ) Notice: Subject to any disclaimer, the term of this patent is extended or adjusted under 35 U.S.C. 154(b) by 197 days.

(21) Appl. No.: 18/273,626

(22) PCT Filed: Jan. 21, 2022

(86) PCT No.: PCT/JP2022/002171
§ 371 (c)(1),
(2) Date: Jul. 21, 2023

(87) PCT Pub. No.: WO2022/158562
PCT Pub. Date: Jul. 28, 2022

(65) Prior Publication Data
US 2024/0098954 A1    Mar. 21, 2024

(30) Foreign Application Priority Data
Jan. 22, 2021    (JP) ................................ 2021-008913

(51) Int. Cl.
B32B 15/06    (2006.01)
B32B 7/02    (2019.01)
(Continued)

(52) U.S. Cl.
CPC ......... H05K 9/0088 (2013.01); H05K 9/0094 (2013.01)

(58) Field of Classification Search
CPC ......... B32B 15/08; B32B 15/06; B32B 15/20; B32B 2255/10; B32B 2255/26;
(Continued)

(56) References Cited

U.S. PATENT DOCUMENTS

| | | | |
|---|---|---|---|
| 11,477,925 B2* | 10/2022 | Toyoda | H05K 9/0094 |
| 2019/0373778 A1* | 12/2019 | Toyoda | H05K 9/0088 |
| 2021/0194147 A1* | 6/2021 | Nagano | B32B 15/085 |

FOREIGN PATENT DOCUMENTS

| | | |
|---|---|---|
| JP | 2005-311330 A | 11/2005 |
| JP | 2020-145278 A | 9/2020 |
| WO | WO 2018/088492 A1 | 5/2018 |

OTHER PUBLICATIONS

International Search Report (PCT/ISA/210) issued in PCT/JP2022/002171, dated Apr. 19, 2022.

* cited by examiner

*Primary Examiner* — Timothy J Thompson
*Assistant Examiner* — Guillermo J Egoavil
(74) *Attorney, Agent, or Firm* — Birch, Stewart, Kolasch & Birch, LLP

(57) ABSTRACT

The present invention realizes an electric-wave absorber of a so-called electric-wave interference type, which can favorably absorb absorption electric waves of a desired frequency even when a protective layer for protecting an electric resistance film is formed on the surface of the electric resistance film, and a manufacturing method for the electric-wave absorber. In an electric-wave absorber of an electric-wave interference type, which is formed by sequentially stacking an electric resistance film 1, a dielectric layer 2, and an electric-wave shielding layer 3, absorption electric waves to be absorbed by the electric-wave absorber are waves in a high frequency band in or above a millimeter-wave band, a protective layer 4 is included on the electric resistance film, and a thickness of the dielectric layer is smaller than a reference thickness dst obtained according to the frequency of the absorption electric waves and the permittivity of the dielectric layer.

8 Claims, 5 Drawing Sheets

(51) Int. Cl.
  *B32B 7/12* (2006.01)
  *B32B 15/20* (2006.01)
  *B32B 27/36* (2006.01)
  *C08J 5/18* (2006.01)
  *C08L 65/00* (2006.01)
  *H05K 9/00* (2006.01)

(58) Field of Classification Search
  CPC ........ B32B 2307/202; B32B 2307/204; B32B 2307/212; B32B 7/025; B32B 27/36; B32B 7/02; B32B 7/12; B32B 27/302; C08J 2365/00; C08J 2425/08; C08J 2427/16; C08J 2467/02; C08J 5/18; C08L 2203/16; C08L 2203/206; C08L 2205/03; C08L 27/16; C08L 65/00; C08L 67/00; H05K 9/0088; H05K 9/0094; H05K 9/00
  USPC .............................. 361/816; 438/411.1, 138
  See application file for complete search history.

(a)

(b)

ELECTRIC-WAVE ABSORBER AND MANUFACTURING METHOD FOR ELECTRIC-WAVE ABSORBER

TECHNICAL FIELD

The present disclosure relates to an electric-wave absorber that absorbs unwanted electric waves, and in particular, relates to an electric-wave absorber of a so-called electric-wave interference type including a protective layer for protecting an electric resistance film on a surface on which electric waves are incident, and a manufacturing method for the same.

BACKGROUND ART

Electric-wave absorbers that absorb electric waves have been used to avoid the influence of leaked electric waves emitted to the outside from an electrical circuit or the like, and the influence of electromagnetic waves reflected in an undesired manner.

In recent years, research has also advanced regarding technology that uses centimeter waves having a frequency band of several gigahertz (GHz), a millimeter-wave band having a frequency of 30 gigahertz to 300 gigahertz, and furthermore, electric waves having a frequency in a terahertz (THz) band as electric waves in a high frequency band exceeding the millimeter-wave band, in mobile communication such as mobile telephones, wireless LANs, electronic toll collection systems (ETC), and the like.

In response to the technological trend of using such high-frequency electric waves, it is thought that demand to enable absorption of electric waves in the millimeter-wave band and higher frequency bands will increase for electric-wave absorbers that absorb unnecessary electric waves.

As an electric-wave absorber that suppresses the reflection of unnecessary electric waves and absorbs the unnecessary electric waves, an electric-wave absorber of a so-called electric-wave absorption type (also called a λ/4 type or a reflection type) is known, in which an electric resistance film is provided on the surface of a dielectric layer on which electric waves are incident, an electric-wave shielding layer that reflects electric waves is provided on the underside surface on the opposite side of the dielectric layer, and electric waves reflected from the electric-wave absorber cancel each other out and are absorbed by shifting the phases of the electric waves reflected by the electric-wave shielding layer and emitted to the outside by half the wavelength from the phases of the electric waves reflected by the surface of the electric resistance film. The electric-wave absorbers of the electric-wave interference type are lighter than electric-wave absorbers of a type that magnetically absorbs electric waves with magnetic particles, and can be manufactured easily, and therefore they have the advantage of being able to reduce cost.

As an electric-wave absorbing sheet that is a thin electric-wave interference type electric-wave absorber, the inventors have proposed an electric-wave absorbing sheet that is easy to handle, highly flexible, and can favorably absorb electric waves in a desired frequency band by using a conductive organic polymer film as an electric resistance film formed on the surface of a dielectric layer (see Patent Document 1).

PRIOR ART DOCUMENTS

Patent Document

Patent Document 1: WO 2018/088492

DISCLOSURE OF INVENTION

Problem to be Solved by the Invention

In general, in electric-wave absorbers and electric-wave absorbing sheets, the frequency of electric waves to be absorbed by the electric-wave absorbers and electric-wave absorbing sheets (hereinafter referred to as "absorption electric waves") is set according to the usage environment and purpose. In the case of the above electric-wave absorbing sheet of the electric-wave interference type, the peak of the electric-wave absorbing properties of the electric-wave absorbing sheet can be matched with frequency of the absorption electric waves by setting the thickness of the dielectric layer to a reference thickness (dst), which is a predetermined thickness calculated based on the frequency of the absorption electric waves. Also, in the above-described conventional electric-wave absorbing sheet, since the electric resistance film is made of a conductive organic polymer film, it is effective to provide a protective layer for protecting the surface of the electric resistance film in order to prevent the surface electric resistance from changing due to damage to the surface of the electric resistance film.

However, as a result of studies conducted by the inventors, it was found that even if the thickness of the dielectric layer is set to the reference thickness dst obtained based on the frequency of the electric waves to be absorbed, the peak frequency of the absorbing properties of the electric waves absorbed by the electric-wave absorbing sheet is different from the set frequency of the absorption electric waves if a protective layer is provided on the surface of the electric resistance film. For this reason, if the peak value of the frequency of the absorbing properties of the electric waves absorbed by the electric-wave absorbing sheet shifts, a situation arises in which the absorption electric waves, which are electric waves of a desired frequency, cannot be sufficiently absorbed.

The present disclosure aims to solve the problem of the conventional electric-wave absorbing sheet described above, and realize a so-called electric-wave interference type electric-wave absorber that can favorably absorb electric waves even if a protective layer for protecting an electric resistance film is formed on the surface of the electric resistance film, and a manufacturing method for such an electric-wave absorber.

Means for Solving Problem

In order to solve the above problem, the electric-wave absorber disclosed in the present application is an electric-wave absorber of an electric-wave interference type including an electric resistance film, a dielectric layer, and an electric-wave shielding layer that are sequentially stacked on each other, in which absorption electric waves to be absorbed by the electric-wave absorber are electric waves in a high frequency band in or above a millimeter-wave band, the electric-wave absorber further includes a protective layer on the electric resistance film, the protective layer has a permittivity of 2 or more and 20 or less, and a thickness of 10 μm or more and 150 μm or less, and a permittivity D of the dielectric layer is 2 or more and 8 or less, and a thickness of the dielectric layer is smaller than a reference thickness dst determined according to the frequency of the absorption electric waves and the permittivity of the dielectric layer.

Also, the manufacturing method for an electric-wave absorber disclosed in the present application is a manufacturing method for an electric-wave absorber of an electric-wave interference type that absorbs electric waves in a high frequency band in or above a millimeter-wave band, and in which an electric resistance film, a dielectric layer, and an electric-wave shielding layer are sequentially stacked, the method including providing a protective layer having a permittivity of 2 or more and 20 or less and a thickness of 10 μm or more and 150 μm or less on the electric resistance film, in which the dielectric layer has a permittivity D of 2 or more and 8 or less, and a thickness of the dielectric layer is set smaller than a reference thickness dst obtained according to the frequency of the absorption electric waves and the permittivity of the dielectric layer.

Effects of the Invention

The electric-wave absorbing sheet disclosed in the present application includes a protective layer having a permittivity of 2 or more and 20 or less and a thickness of 10 μm or more and 150 μm or less on the surface of an electric resistance film, and the thickness of a dielectric layer having a permittivity of 2 or more and 8 or less is smaller than a reference thickness dst. For this reason, desired absorption electric waves can be favorably absorbed while obtaining the effect of protecting the electric resistance film by the protective layer.

Also, in the manufacturing method for an electric-wave absorbing sheet disclosed in the present application, production is performed with the thickness of the dielectric layer set smaller than the reference thickness dst obtained according to the frequency of the absorption electric waves and the permittivity of the dielectric layer. For this reason, it is possible to manufacture an electric-wave absorber that has a protective layer that protects the electric resistance film and that favorably absorbs desired absorption electric waves.

DESCRIPTION OF THE INVENTION

Figure 1:
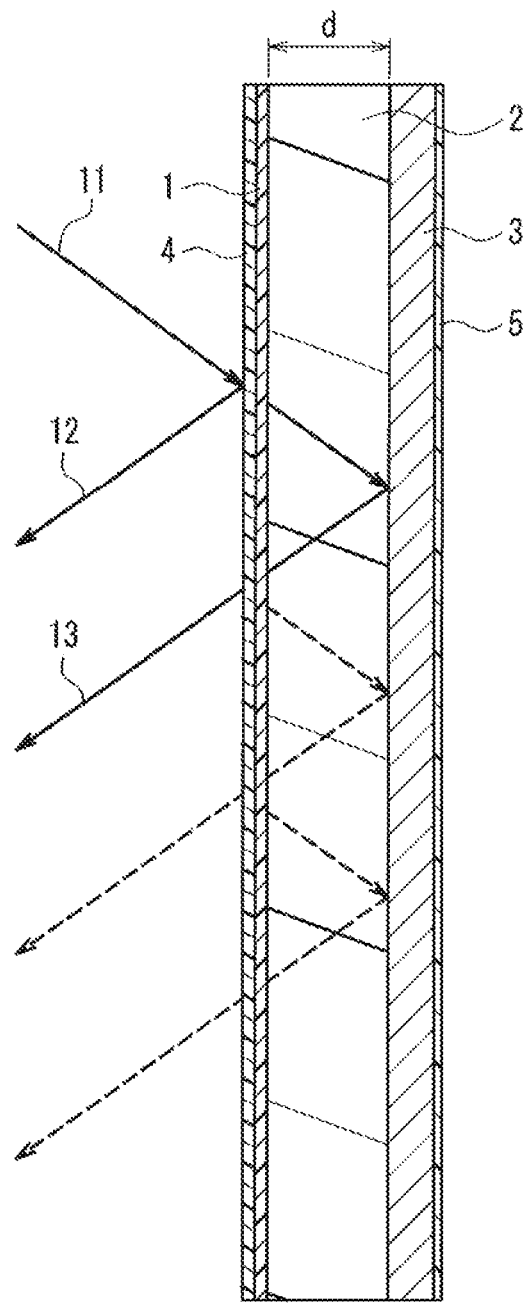
FIG. 1 is a cross-sectional view illustrating a configuration of an electric-wave absorbing sheet according to this embodiment.

The electric-wave absorber disclosed in this application is an electric-wave absorber of an electric-wave interference type comprising an electric resistance film, a dielectric layer, and an electric-wave shielding layer that are sequentially stacked on each other, in which absorption electric waves to be absorbed by the electric-wave absorber are electric waves in a high frequency band in or above a millimeter-wave band, the electric-wave absorber further comprises a protective layer on the electric resistance film, the protective layer has a permittivity of 2 or more and 20 or less, and a thickness of 10 μm or more and 150 μm or less, and a permittivity D of the dielectric layer is 2 or more and 8 or less, and a thickness of the dielectric layer is smaller than a reference thickness dst determined according to the frequency of the absorption electric waves and the permittivity of the dielectric layer, and satisfies any one of the following conditions 1) to 4)

1) in a case where the frequency of the absorption electric waves is 28.5 GHz or more and 60 GHz or less, the value of a reduction rate T of the thickness of the dielectric layer from the reference thickness dst is a value between a curve represented by (Formula 1) below and a curve represented by (Formula 2) below with respect to the permittivity D of the dielectric layer, and deviation of a maximum absorption frequency of the electric waves that are to actually be absorbed by the electric-wave absorber from the frequency of the absorption electric waves is within 55%

$Tmax = -0.021 \times D^2 + 0.26 \times D - 1.35$ (Formula 1)

$Tmin = -0.0005 \times D^2 + 0.0056 \times D - 0.017$ (Formula 2)

2) in a case where the frequency of the absorption electric waves is greater than 60 GHz and not more than 90 GHz, the value of a reduction rate T of the thickness of the dielectric layer from the reference thickness dst is a value between a curve represented by (Formula 3) below and a curve represented by (Formula 4) below with respect to the permittivity D of the dielectric layer, and deviation of a maximum absorption frequency of the electric waves that are to actually be absorbed by the electric-wave absorber from the frequency of the absorption electric waves is within 55%

$Tmax = -0.014 \times D^2 + 0.20 \times D - 1.33$ (Formula 3)

$Tmin = -0.0002 \times D^2 - 0.0029 \times D + 0.008$ (Formula 4)

3) in a case where the frequency of the absorption electric waves is greater than 90 GHz and not more than 140 GHz, the value of a reduction rate T of the thickness of the dielectric layer from the reference thickness dst is a value between a curve represented by (Formula 5) below and a curve represented by (Formula 6) below with respect to the permittivity D of the dielectric layer, and deviation of a maximum absorption frequency of the electric waves that are to actually be absorbed by the electric-wave absorber from the frequency of the absorption electric waves is within 55%

$Tmax = -0.013 \times D^2 + 0.19 \times D - 1.32$ (Formula 5)

$Tmin = -0.0003 \times D^2 + 0.0017 \times D - 0.0024$ (Formula 6)

4) in a case where the frequency of the absorption electric waves is not less than 200 GHz and not more than 414 GHz, the value of a reduction rate T of the thickness of the dielectric layer from the reference thickness dst is a value between a curve represented by (Formula 7) below and a curve represented by (Formula 8) below with respect to the permittivity D of the dielectric layer, and deviation of a maximum absorption frequency of the electric waves that are to actually be absorbed by the electric-wave absorber from the frequency of the absorption electric waves is within 5%.

$$T\max=-0.0060 \times D^2+0.099 \times D-1.13 \quad \text{(Formula 7)}$$

$$T\min=-0.0001 \times D^2+8 \times 10^{-5} \times D-0.017 \quad \text{(Formula 8)}$$

By doing so, the electric-wave absorber disclosed in the present application can improve the weather resistance and resistance to physical impact of the electric resistance film with the protective layer, and can realize a favorable electric-wave absorbing properties with respect to the absorption electric waves by suppressing the influence of the shifting of the frequency of the electric waves to be absorbed, by the protective layer.

Note that it is preferable that a return loss for electric waves with the absorption frequency is 10 dB or more.

Also, it is preferable that the electric resistance film is constituted by a conductive organic polymer film. Also, it is preferable that the electric resistance film contains at least one of carbon microcoils, carbon nanotubes, and graphene. By doing so, the electric resistance film can be easily formed, and the surface electric resistance thereof can be maintained even if the electric-wave absorber is deformed.

Furthermore, it is preferable that the protective layer, the electric resistance film, and the dielectric layer are all made of members with light transmittance, the electric-wave shielding layer is made of a metal mesh, and an overall light transmission rate of the electric-wave absorber is 30% or more. By doing so, it is possible to view the other side through the electric-wave absorber, and thus it is possible to easily observe the state of an electric-wave source that shields the electric waves, or the shielded device that is to be protected from electric waves from the outside.

Moreover, it is preferable to further include an adhesive layer on a back surface of the electric-wave shielding layer. By doing so, the electric-wave absorber can be easily arranged at a desired position.

Also, it is preferable that the protective layer, the electric resistance film, the dielectric layer, and the electric-wave shielding layer are all produced in the form of thin films, and are formed into a flexible sheet as a whole. By doing so, it is possible to realize an electric-wave absorber that is easy to handle.

The manufacturing method for an electric-wave absorber disclosed in the present application is a manufacturing method for an electric-wave absorber of an electric-wave interference type that absorbs electric waves in a high frequency band in or above a millimeter-wave band, and in which an electric resistance film, a dielectric layer, and an electric-wave shielding layer are sequentially stacked, the method including providing a protective layer having a permittivity of 2 or more and 20 or less and a thickness of 10 μm or more and 150 μm or less on the electric resistance film, in which the dielectric layer has a permittivity D of 2 or more and 8 or less, and a thickness of the dielectric layer is set smaller than a reference thickness dst obtained according to the frequency of the absorption electric waves and the permittivity of the dielectric layer.

By doing so, with the manufacturing method for an electric-wave absorber disclosed in the present application, it is possible to suppresses the influence of the frequency shift of the electric waves to be absorbed, which is caused by the influence of the protective layer formed by the dielectric layer, and thus it is possible to easily manufacture an electric-wave absorber exhibiting favorable electric-wave absorbing properties with respect to the absorption electric waves.

Hereinafter, the electric-wave absorber disclosed in the present application will be described with reference to the drawings.

Here, as the electric-wave absorber illustrated in the present application, an electric-wave absorbing sheet that has a thickness sufficiently smaller than a main surface area and can be understood as a sheet will be illustrated and described. In this manner, the electric-wave absorber illustrated in the present application is a concept that includes an electric-wave absorbing sheet, which can be understood as a sheet due to the relationship between its surface area and thickness, and an electric-wave absorbing block that is relatively thick and is understood as a block shape overall.

Note that, as will be described later, since the thickness of the dielectric layer of the electric-wave absorber of the electric-wave interference type is proportional to the reciprocal of the frequency of the electric waves to be absorbed, the dielectric layer is not so thick in the electric-wave absorber in which the frequency of the electric waves to be absorbed is a high frequency in or above a millimeter-wave band. In addition, for example, in the case of applications such as a case of being arranged without gaps on the surface of an electronic device that is a noise source, or a case of protecting an electronic device arranged inside a housing that forms an outer shell from unwanted external electric waves, it is effective, in terms of practical use, for the electric-wave absorber to have a certain surface area or more. For this reason, it is thought that it is more common for the electric-wave absorber disclosed in the present application to take the form of a sheet having a constant surface area and a small thickness.

Embodiments

FIG. 1 is a cross-sectional view showing the configuration of an electric-wave absorbing sheet (electric-wave absorber) according to this embodiment.

Note that FIG. 1 is a diagram provided to facilitate understanding of the configuration of the electric-wave absorbing sheet according to the present embodiment, and the sizes, particularly the thicknesses, of the members shown in the diagram are not shown as they are in reality.

[Overall Configuration of Electric-Wave Absorbing Sheet]

In the electric-wave absorbing sheet exemplified in this embodiment, an electric resistance film 1, a dielectric layer 2, and an electric-wave shielding layer 3 are stacked in this order, and a protective layer 4 is further formed on the surface of the electric resistance film 1 on the side on which the electric waves are incident, that is, on the surface of the electric resistance film 1 opposite to the side on which the dielectric layer 2 is arranged. Note that in the electric-wave absorbing sheet illustrated in FIG. 1, the adhesive layer 5 is stacked and formed on the back side of the electric-wave shielding layer 3, that is, on the surface of the electric-wave shielding layer 3 opposite to the side on which the dielectric layer 2 is arranged.

The electric-wave absorbing sheet according to the present embodiment is of an electric-wave interference type (also referred to as a λ/4 type or a reflection type), and electric waves 11 incident on the dielectric layer 2 from the electric resistance film 1 side are reflected at the interface with the electric-wave shielding layer 3 arranged on the back side of the dielectric layer 2, and are emitted to the outside once again as reflected waves 13. At this time, by setting a thickness d of the dielectric layer 2 to ¼ of the wavelength λ of the incident electric waves (d=λ/4), primary reflected waves 12 reflected on the surface of the electric-wave absorbing sheet and secondary reflected waves 13 reflected on the surface of the electric-wave shielding layer 3 are out of phase by half the wavelength (180°), whereby they cancel each other out, and the electric waves are seemingly absorbed by the electric-wave absorbing sheet. Note that tertiary reflected waves and higher-order reflected waves such as quaternary reflected waves and higher, which are indicated by the dotted lines in FIG. 1, are superimposed because they are in phase with the primary reflected waves and the secondary reflected waves, respectively, but have little influence since their energy is small.

Here, d=λ/4 holds true when a substance with a permittivity ε=1 is used as the dielectric layer 2, and when the permittivity of the dielectric used for the dielectric layer 2 is $\varepsilon_r$, $d=\lambda/(4(\varepsilon_r)^{-1/2})$ hold true, and the thickness d of the dielectric layer 2 can be reduced by $1/(\varepsilon_r)^{-1/2}$. By making the dielectric layer 2 thin, it is possible to reduce the overall thickness of the electric-wave absorbing sheet and reduce the cost of the electric-wave absorbing sheet, and a flexible electric-wave absorbing sheet or an elastic electric-wave absorbing sheet can be realized more easily.

On the other hand, based on the principle of electric wave absorption in the electric-wave absorber of the electric-wave interference type described above, in the electric-wave absorber of the electric-wave interference type, it is important that the thickness d of the dielectric layer 2 is set to a reference thickness dst, which is an ideal thickness obtained based on the frequency of the absorption electric waves, which are electric waves that are to be absorbed by the electric-wave absorber based on its permittivity cr.

The electric-wave shielding layer 3 formed by stacking on the rear surface side of the dielectric layer 2 is a layer that reflects incident electric waves at the surface on the dielectric layer 2 side, which is the interface with the dielectric layer 2. For this reason, the electromagnetic shielding layer 3 is called a reflective layer in some cases.

Based on the principle of electric-wave absorption in the electric-wave interference type electric-wave absorbing sheet according to this embodiment, the electric-wave shielding layer 3 need only function as a reflective layer that reflects electric waves, and can easily be realized as a metal layer made of a metal plate. Note that in order to make the electric-wave absorber flexible as a sheet for easy handling, a metal foil or a metallic thin film formed by vapor-depositing a metallic material on a thin film made of a non-metallic material such as resin is more preferably used as the electric-wave shielding layer 3.

In addition, if the electric resistance film, the dielectric layer, and the later-described protective layer are made of a material that allows light to pass through and the electric-wave absorbing sheet as a whole has a predetermined light transmittance (for example, a total light transmission rate of 30% or more, which is considered effective in terms of practical use), in order to provide the electric-wave shielding layer 3 with light transmittance as well, it is preferable that the electric-wave shielding layer 3 is made of a conductive mesh made of conductive fibers obtained by coating metal wires or conductive members.

In the electric-wave interference type electric-wave absorbing sheet, the electric resistance film 1 performs impedance matching between the electric-wave absorbing sheet and the air on the front side of the dielectric layer 2, which is the side on which the electric waves to be absorbed are incident.

When electric waves propagating through the air are incident on the electric-wave absorbing sheet, if the input impedance value of the electric-wave absorbing sheet is different from the impedance value of the air, the amount of reflection of the electric waves incident on the electric-wave absorbing sheet increases due to this impedance difference, and the electric-wave absorbing properties of the electric-wave absorbing sheet deteriorates. For this reason, it is important to set the input impedance of the electric-wave absorbing sheet to 377Ω, which is equal to the impedance of air (more accurately, the impedance value in a vacuum) to prevent the electric-wave absorbing properties from deteriorating due to reflecting and scattering of the electric waves at the interface between the dielectric layer and the electric resistance film when the electric waves are incident on the electric-wave absorbing sheet.

In the electric-wave absorbing sheet of this embodiment, by forming the electric resistance film 1 as a film of a conductive organic polymer, flexibility as an electric-wave absorbing sheet is ensured, and favorable impedance matching can be maintained without causing cracks or the like in the electric resistance film 1 and without the surface electric resistance changing, even when the electric-wave absorbing sheet is strongly bent. It should be noted that it is not essential for the electric-wave absorbing sheet disclosed in the present application to use the conductive organic polymer film as the electric resistance film 1, and if the electric-wave absorbing sheet is not required to be flexible, such as a case where the electric-wave absorbing sheet is thick, or a case where the location where the electric-wave absorbing sheet is used is a flat surface, it is possible to use a conventional hard electric resistance film 1 formed by subjecting a metal oxide such as indium tin oxide (ITO), indium oxide, tin oxide, zinc oxide, metal nitrides, or mixtures thereof to ion plating, vapor deposition, sputtering, or the like.

The protective layer 4 is a member that is formed on the surface of the electric resistance film 1, that is, on the uppermost surface of the electric-wave absorbing sheet on the side where electric waves are incident, and protects the electric resistance film 1. The surface electric resistance of the electric resistance film 1 of the electric-wave absorbing sheet may change when moisture adheres to the surface. In particular, when a conductive organic polymer film is used as the electric resistance film 1, there is a risk that the surface will be damaged when a sharp member comes into contact with it or when it is rubbed with a hard material, and thus the surface electric resistance of the electric resistance film 1 will change. Therefore, it is important to protect the electric resistance film 1 by covering the surface of the electric resistance film 1 with the protective layer 4 to maintain the impedance matching state.

On the other hand, as a result of studies conducted by the inventors, it was confirmed that the peak wavelength of electric waves to be absorbed by the electric-wave absorber changes between the case where the protective layer is provided and the case where the protective layer is not provided. As described above, in order to obtain a favorable electric-wave absorbing properties in an electric-wave absorber of an electric-wave interference type, it is important to match the thickness of the dielectric layer 2 with a predetermined reference thickness dst determined according to the frequency of the absorption electromagnetic waves, which are the electric waves to be absorbed. However, even if the thickness of the dielectric layer 2 can be matched with the reference thickness dst by adjusting manufacturing conditions, the electric-wave absorber having a favorable electric-wave absorbing properties cannot be obtained if the peak wavelength of the electric waves to be absorbed shifts due to the protective layer 4 being provided.

In view of this, in the electric-wave absorber disclosed in the present application, by reducing the thickness of the dielectric layer 2 by a predetermined amount from the reference thickness dst, it is possible to cancel out the change in the peak frequency of the electric waves to be absorbed by the electric-wave absorber due to the dielectric layer 4, and to favorably absorb the electric waves of the predetermined frequency. A preferable thickness of the dielectric layer 2 when the protective layer 4 is provided will be described in detail later.

The adhesive layer 5 is a layer that is formed on the rear surface of the electric-wave shielding layer 3 such that the electric-wave absorbing sheet can be easily adhered to a predetermined location. The adhesive layer 5 can be easily formed by applying a tacky resin paste.

Note that the adhesive layer 5 is not an essential member in the electric-wave absorbing sheet according to the present embodiment. When the electric-wave absorbing sheet is disposed at a predetermined location, a member for adhesion may be disposed on the member to which the electric-wave absorbing sheet is adhered, and when the electric-wave absorbing sheet is disposed at a predetermined location, an adhesion method such as supplying the adhesive between the electric-wave absorbing sheet and the disposing location, or using double-sided tape can be employed.

[Details of Members]

Next, as the electric-wave absorbing sheet according to this embodiment, each member constituting the electric-wave absorbing sheet that is flexible overall due to the electric resistance film being made of a conductive organic polymer will be described in detail.

<Electric Resistance Film>

In the electric-wave absorbing sheet according to the present embodiment, the electric resistance film is constituted by a conductive organic polymer.

It is preferable that a conjugate conductive organic polymer is used as the conductive organic polymer, and it is preferable to use polythiophene or a derivative thereof, or polypyrrole or a derivative thereof as the conductive organic polymer.

Specific examples of a polythiophene-based conductive polymer that is suitable to be used in the electric resistance film of the electric-wave absorbing sheet according to the present embodiment include poly(thiophene), poly(3-methylthiophene), poly(3-ethylthiophene), poly(3-propylthiophene), poly(3-butylthiophene), poly(3-hexylthiophene), poly(3-heptylthiophene), poly(3-octylthiophene), poly(3-decylthiophene), poly(3-dodecylthiophene), poly(3-octadecylthiophene), poly(3-bromothiophene), poly(3-chlorothiophene), poly(3-iodothiophene), poly(3-cyanothiophene), poly(3-phenylthiophene), poly(3,4-dimethylthiophene), poly(3,4-dibutylthiophene), poly(3-hydroxythiophene), poly(3-methoxythiophene), poly(3-ethoxythiophene), poly(3-butoxythiophene), poly(3-hexyloxythiophene), poly(3-heptyloxythiophene), poly(3-octyloxythiophene), poly(3-decyloxythiophene), poly(3-dodecyloxythiophene), poly(3-octadecyloxythiophene), poly(3,4-dihydroxythiophene), poly(3,4-dimethoxythiophene), poly(3,4-diethoxythiophene), poly(3,4-dipropoxythiophene), poly(3,4-dibutoxythiophene), poly(3,4-dihexyloxythiophene), poly(3,4-diheptyloxythiophene), poly(3,4-dioctyloxythiophene), poly(3,4-didecyloxythiophene), poly (3,4-didodecyloxythiophene), poly(3,4-ethylenedioxythiophene), poly(3,4-propylenedioxythiophene), poly(3,4-butenedioxythiopene), poly(3-methyl-4-methoxythiophene), poly(3-methyl-4-ethoxythiophene), poly(3-carboxythiophene), poly(3-methyl-4-carboxythiophene), poly(3-methyl-4-carboxyethylthiophene), and poly(3-methyl-4-carboxybutylthiophene).

Also, specific examples of a polypyrrole-based conductive polymer that is suitable to be used in the electric resistance film include polypyrrole, poly(N-methylpyrrole), poly(3-methylpyrrole), poly(3-ethylpyrrole), poly(3-n-propylpyrrole), poly(3-butylpyrrole), poly(3-octylpyrrole), poly(3-decylpyrrole), poly(3-dodecylpyrrole), poly(3,4-dimethylpyrrole), poly(3,4-dibutylpyrrole), poly(3-carboxypyrrole), poly(3-methyl-4-carboxypyrrole), poly(3-methyl-4-carboxyethylpyrrole), poly(3-methyl-4-carboxybutylpyrrole), poly(3-hydroxypyrrole), poly(3-methoxypyrrole), poly(3-ethoxypyrrole), poly(3-butoxypyrrole), poly(3-hexyloxypyrrole), poly(3-methyl-4-hexyloxypyrrole), and poly(3-methyl-4-hexyloxypyrrole).

In addition, an organic polymer in which the main chain is constituted by a π-conjugated system can be used as the electric resistance film, and a polyacene-based conductive polymer, a polyphenylene-based conductive polymer, a polyphenylene vinylene-based conductive polymer, a polyaniline-based conductive polymer, a polyacetylene-based conductive polymer, a polythiophene vinylene-based conductive polymer, copolymers thereof, and the like can be used as the electric resistance film.

Note that polyanions can be used as counter anions in the conductive organic polymer used in the electric resistance film. Although there is no particular limitation on the polyanions, it is preferable that an anion group that can cause chemical oxidation doping to occur is included in the conjugate conductive organic polymer used in the above-described electric resistance film 1. Examples of this kind of anion group include groups represented by the general formulas —O—$SO_3$X, —O—PO(OX)$_2$, —COOX, —$SO_3$X, and the like (in the formulas, X indicates a hydrogen atom or an alkali metal atom), and among these, the groups indicated by —$SO_3$X and —O—$SO_3$X are particularly preferable since they have an excellent dope effect on conjugate conductive organic polymers.

The above-described conductive organic polymers may be used alone, or in combination of two or more. Among the materials described as examples above, a polymer composed of one or two types selected from polypyrrole, poly(3-methoxythiophene), poly(3,4-ethylenedioxythiophene), poly(2-anilinesulfonic acid), and poly(3-anilinesulfonic acid) is preferable since they have higher transparency and conductivity.

In particular, poly(3,4-ethylenedioxythiophene: PEDOT) and polystyrene sulfonic acid (PSS) can be used as the combination of the conjugated conductive organic polymer and the polyanion.

Also, in the electric resistance film of the electric-wave absorbing sheet according to the present embodiment, a dopant can be used in combination to match the input impedance of the electric-wave absorbing sheet with the impedance in the air by controlling the electric conductivity of the conductive organic polymer. Halogens such as iodine and chlorine, Lewis acids such as $BF_3$ and $PF_5$, proton acids such as nitric acid and sulfuric acid, transition metals, alkali metals, amino acids, nucleic acids, surfactants, pigments, chloranil, tetracyanoethylene, TCNQ, and the like can be used as the dopant. The surface electric resistance of the resistance film can be adjusted using the blending ratio of the conductive organic polymer and the dopant. The preferable blending ratio of the conductive organic polymer and the dopant can be set to, for example, conductive organic polymer:dopant=1:2 to 1:4 in terms of mass ratio.

Furthermore, a material that also contains polyvinylidene fluoride and water-soluble polyester is preferable as the material constituting the electric resistance film. As a result of the material containing these compounds, the weather resistance of the electric resistance film improves, and therefore change over time in the surface electric resistance of the electric resistance film can be suppressed, and it is possible to expand the design tolerance of the material and thickness of the protective layer for protecting the electric resistance film.

Polyvinylidene fluoride can fulfill the function of a binder in the conductive organic polymer, improve film formation, and increase areal contact with the base due to being added to the composition when coating the conductive organic polymer.

Also, since water-soluble polyester has a high compatibility with the conductive polymer, the conductive polymer can be immobilized in the electric resistance film 1 by adding the water-soluble polyester to the coating composition of the conductive organic polymer constituting the electric resistance film, and it is possible to form a more homogeneous film. As a result, by using the water-soluble polyester, it is possible to reduce the amount of change in the surface electric resistance, even in a more severe high-temperature high-humidity environment.

The content of the conductive organic polymer in the electric resistance film is preferably 10 mass % or more and 35 mass % or less with respect to the total mass of the solid content included in the composition of the electric resistance film. If the content falls below 10 mass %, the conductivity of the electric resistance film tends to decrease. For this reason, as a result of the surface electric resistance of the electric resistance film being set to a predetermined range in order to achieve impedance matching, the electric-wave absorbing sheet tends to become thicker overall and the optical properties tend to deteriorate due to the film thickness of the electric resistance film increasing. On the other hand, if the content exceeds 35 mass %, the coating suitability at the time of coating the electric resistance film decreases due to the structure of the conductive organic polymer, and it tends to be difficult to form a favorable electric resistance film, haze of the electric resistance film tends to increase, and the optical properties tend to deteriorate.

Also, a configuration is possible in which the electric resistance film includes a carbon material such as carbon microcoils, carbon nanotubes, and graphene.

A carbon microcoil is a type of vapor-grown carbon fiber obtained mainly through catalytically activated pyrolysis of acetylene, and is a material with a 3D-helical/spiral structure with a coil diameter on the order of microns. Preferably, the coil diameter is 1 to 10 μm, the diameter of the carbon fiber forming the coil is 0.1 to 1 μm, and the length of the coil is 1 to 10 mm.

Specifically, carbon nanotubes can be obtained through, for example, vapor deposition methods such as arc discharge, laser vaporization, and thermal decomposition. The carbon nanotubes used in the electric resistance film of the electric-wave absorbing sheet according to this embodiment may be either single-layered or multi-layered.

Graphene can be obtained through, for example, a peel transfer method, a SiC thermal decomposition method, a chemical vapor deposition method, a method of cutting carbon nanotubes, or the like. As the graphene used in the electric resistance film of the electromagnetic-wave absorbing sheet according to the present embodiment, it is preferable that scale-shaped powdery graphene is used from the viewpoint of easily obtaining a desired aspect ratio and from the viewpoint of the orientation in the electromagnetic-wave absorbing sheet.

A water-soluble polyester resin can be used as the resin in which the carbon material is dispersed.

Note that the electric resistance film can be formed by coating the base with a coating composition serving as a coating material for forming the electric resistance film and drying the resulting composition as described above.

A coating method such as bar-coating, reverse coating, gravure coating, micro-gravure coating, die-coating, dipping, spin-coating, slit-coating, and spray-coating can be used as the method for coating the base with the coating material for forming the electric resistance film. The drying performed after the coating is preferably performed for 5 to 60 minutes at 100 to 150° C., as long as the solvent component of the coating material for forming the electric resistance film evaporates. If the solvent remains in the electric resistance film, the strength tends to deteriorate. For example, hot air drying, heating drying, vacuum drying, natural drying, or the like can be performed as the drying method. Also, the electric resistance film may be formed by emitting UV light (ultraviolet rays) or an EB (electron beam) to the coating film to cure the coating film.

Note that although the base used to form the electric resistance film is not particularly limited, a transparent base that has transparency is preferable thereas. Various materials such as resin, rubber, glass, and a ceramic material can be used as the material of the transparent base.

<Dielectric Layer>

The dielectric layer of the electric-wave absorbing sheet according to the present embodiment can be formed using a dielectric such as titanium oxide, polyvinylidene fluoride, polyester resin, glass, silicone rubber. Note that the dielectric layer can be formed as a one-layer configuration using one type of material, or can have a configuration in which two or more layers of the same type or different types of material are stacked. Coating, press-molding, extrusion molding, or the like can be used to form the dielectric layer.

As described above, the electric-wave absorbing sheet according to the present embodiment is an electric-wave interference type ($\lambda/4$) electric-wave absorbing sheet in which the phase of the electric waves incident on the electric-wave absorbing sheet and the phase of the reflected waves reflected by the electric-wave shielding layer are shifted by ½ the wavelength, whereby the incident waves and the reflected waves cancel each other out, and the electric waves are absorbed. For this reason, the thickness (d in FIG. 1) of the dielectric layer is set corresponding to the wavelength to the electric waves to be absorbed.

Note that, regarding the value of d, if there is space between the electric resistance film and the electric-wave shielding layer, that is, if the dielectric layer is made of air, $d=\lambda/4$ holds true, and if the dielectric layer is made of a material with permittivity $\varepsilon r$, then $d=\lambda/4(\varepsilon r)^{-1/2}$ holds true. This is more preferable because when the electric-wave absorbing sheet according to the present embodiment is flexible, the dielectric layer is thinner, the electric-wave absorbing sheet is thinner overall, and the electric-wave absorbing sheet can be easily bent. In addition, considering that the electric-wave absorbing sheet according to this embodiment is often used by being attached using a later-described adhesive layer or the like to a member in which electric wave leakage is to be prevented, it is preferable that the electric-wave absorbing sheet is thin and the sheet easily conforms to the shape of the adhered portion, and that the sheet is made lighter.

The dielectric layer of the electric-wave absorbing sheet according to the present embodiment is produced to be thinner than the design thickness (reference thickness) dst ($=\lambda/4(\varepsilon r)^{-1/2}$) obtained using the frequency a of the electric waves to be absorbed due to the permittivity εr of the dielectric layer as a reference. The range of the thickness reduction rate from the reference thickness is determined according to the frequency of electric waves to be absorbed by the electric-wave absorbing sheet. The thickness reduction rate of the dielectric layer will be described in detail later.

<Electric-Wave Shielding Layer>

The electric-wave shielding layer of the electric-wave absorbing sheet according to this embodiment is a member that is arranged on the opposite side of the electric-wave absorbing sheet with the dielectric layer interposed therebetween, and that reflects electric waves incident from the electric resistance film side.

Metal foil is preferable as the material for the electric-wave shielding layer in order to make the electric-wave absorbing sheet flexible, and various metal foils such as copper foil, aluminum foil, and gold foil can be used. Among these, considering the cost and the influence of oxidation in the air, it is preferable to use aluminum foil as the electric-wave shielding layer. A metal foil such as an aluminum foil that forms the electric-wave shielding layer can be easily realized by rolling a metal material. In addition, when the electric-wave shielding layer is made of a vapor deposition film obtained by vapor-depositing a metal on the surface of a non-metallic material, it is preferable to select a vapor deposition method conventionally used for forming various vapor deposition films as appropriate, considering the metal material to be vapor deposited, the heat resistance temperature of the non-metallic material such as a resin that is to be a base material, and the like.

The thickness of the electric-wave shielding layer is preferably 1 μm to 20 μm when aluminum foil is used as a flexible electric-wave absorbing sheet.

Also, in the electric-wave absorbing sheet according to the present embodiment, the electric-wave shielding layer can be made of only a vapor deposition film of a conductive material such as a metal by forming a vapor deposition film of a metal material directly on the surface of the dielectric layer opposite to the side on which the electric resistance film is formed. When a metal deposition film is formed on the back side of the dielectric layer, no gap is formed between the dielectric layer and the electric-wave shielding layer, as compared to the case where the dielectric layer and the electric-wave shielding layer are separately formed and arranged in areal contact with each other. For this reason, the electric waves that have passed through the dielectric layer can be reflected at the position of the back-side surface of the dielectric layer, and the frequency of the electric waves to be absorbed can be accurately controlled according to the thickness d of the dielectric layer.

On the other hand, compared to the case of using a metal foil for the electric-wave shielding layer, when using a vapor deposition film, it is necessary to form the conductive material in the vapor deposition film with a uniform and sufficient density. According to the results of the study performed by the inventors, it is preferable that the surface electric resistance of the electric-wave shielding layer is $1 \times 10^{-1}$ Ω/sq or less, and it is preferable that the thickness of the metal deposition film is sufficiently controlled to set the surface electric resistance to a desired value or less.

In addition, in order for the electric-wave absorbing sheet to be flexible and has light transmittance, a conductive mesh made of conductive fibers can be used as the electric-wave shielding layer. The conductive mesh can be formed, for example, by attaching a metal to a mesh obtained by weaving polyester monofilaments to make it conductive. As the metal, copper, silver, or the like, which are highly conductive, can be used. In addition, in order to reduce the reflection from the metal film covering the surface of the mesh, a product has been made which is obtained by adding a black antireflective layer to the outer side of the metal film.

A conductive lattice in which metal wires such as thin copper wires with a diameter of several tens to several hundreds of μm are arranged horizontally and vertically can be used as the electric-wave shielding layer.

Note that if the electric-wave shielding layer is formed using the above-described mesh or conductive lattice, the electric-wave shielding layer is configured to have the minimal thickness at which it is possible to realize the surface electric resistance required for the electric-wave shielding layer in order to ensure flexibility and light transmittance.

The aperture ratio of the electric-wave shielding layer formed as a mesh or a conductive lattice is preferably larger from the viewpoint of ensuring light transmittance, and is preferably smaller from the viewpoint of reliably reflecting the electric waves on the surface of the electric-wave shielding layer to improve the electric-wave absorbing properties of the electric-wave absorbing sheet. According to studies performed by the inventors, the aperture ratio is preferably 35% or more and 85% or less, and more preferably 35% or more and 75% or less.

<Protective Layer>

In the electric-wave absorbing sheet according to this embodiment, a protective layer is provided on the surface of the electric resistance film, which is the surface on which the electric waves are incident.

By providing the protective layer, it is possible to prevent the surface electric resistance of the electric resistance film from changing due to the conductive organic polymer or carbon material used as the electric resistance film being influenced by humidity in the air, and to prevent the conductive organic polymer film that is the electric resistance film from being physically damaged.

As the protective layer of the electric-wave absorbing sheet of the present embodiment, a film made of polyethylene terephthalate (PET), which is a polyester film, can be used as an example, and for example, a protective layer formed on a surface film can be obtained by applying a PET film with a predetermined thickness on a conductive organic polymer film, which is the surface film, and drying the PET film. Also, a PET film is dried on another predetermined base film to form a polyethylene terephthalate thin film, which is peeled off from the base film and attached to the surface of the electric resistance film, whereby the protective film can be stacked on the surface film.

Polyester films such as polybutylene terephthalate, polyethylene-2,6-naphthalate, and polytrimethylene terephthalate can be used as the protective layer that can be used as the electric-wave absorbing sheet according to this embodiment, in addition to the polyethylene terephthalate described above. In addition, polyolefins such as polyethylene, polypropylene, polybutene-1, poly-4-methylpentene, and copolymers thereof, and polyvinyl chloride can also be used. Note that polyethylene terephthalate is preferable from the viewpoint of film transparency, high protective function for protecting the electric resistance film, and flexibility.

Also, the film thickness of the protective layer to be formed is preferably 10 μm or more and 150 μm or less. If the thickness of the protective layer is less than 10 μm, the protective function of protecting the surface of the electric resistance film may not be sufficiently fulfilled. A thickness of 150 μm is necessary and sufficient for the protective layer, and if the protective layer is thicker than 150 μm, a negative effect arises in that the protective layer limits the flexibility of the electric-wave absorbing sheet. Also, if the protective layer is thicker than necessary, there is a concern that the process of stacking and adhering the protective layer on the surface of the electric resistance film will become large-scale, and thus it is thought that a protective layer that is thicker than necessary is undesirable from the viewpoint of ease of manufacturing and manufacturing cost.

<Adhesive Layer>

A known material used as an adhesive layer, such as adhesive tape, an acrylic-based adhesive, a rubber-based adhesive, a silicone-based adhesive, or the like can be used as the adhesive layer formed on the back surface of the electric-wave shielding layer such that the electric-wave absorbing sheet according to the present embodiment can be easily arranged at a predetermined position. A tackifier or a cross-linking agent can also be used to adjust the tackiness to the adherend, and to reduce adhesive residue. The tackiness to the adherend is preferably 5 N/10 mm to 12 N/10 mm. If the tackiness is smaller than 5 N/10 mm, the electric-wave absorbing sheet will easily peel off of the adherend or shift in some cases. Also, if the tackiness is greater than 12 N/10 mm, the electric-wave absorbing sheet will be more difficult to peel off of the adherend.

The thickness of the adhesive layer is preferably 20 μm to 100 μm. If the thickness of the adhesive layer is less than 20 μm, the tackiness will decrease, and the electric-wave absorbing sheet will easily peel off of the adherend or shift in some cases. If the thickness of the adhesive layer is greater than 100 μm, the electric-wave absorbing sheet will be unlikely to peel off of the adherend. If the cohesive force of the adhesive layer is small, adhesive residue will appear on the adherend in some cases when the electric-wave absorbing sheet is peeled off. Also, a small cohesive force is a factor contributing to a decreasing in the overall flexibility of the electric-wave absorbing sheet.

Note that an adhesive layer that adheres the electric-wave absorbing sheet to the adherend such that it cannot be peeled off can be used as the adhesive layer used in the electric-wave absorbing sheet according to the present embodiment, and an adhesive layer that performs peelable adhesion can also be used thereas. Also, as described before, in the electric-wave absorbing sheet according to the present embodiment, the configuration including the adhesive layer is not an essential element, but the electric-wave absorbing sheet can be adhered to a desired member using various types of conventionally common adhesion methods.

EXAMPLES

The results of various studies conducted on the electric-wave absorbing sheet according to this embodiment will be described below.

[Thickness Reduction Rate of Dielectric Layer Due to Formation of Protective Layer]

As described above, in the electric-wave absorbing sheet according to this embodiment, the protective layer 4 is formed on the surface of the electric resistance film 1. Then, by reducing the thickness of the dielectric layer 2 from the reference thickness dst obtained based on the frequency of the absorption electric waves to be absorbed by the electric-wave absorbing sheet, in response to the peak frequency shift of the electric waves to be absorbed by the electric-wave absorbing sheet, which is caused by the formation of the protective layer 4, the change in the peak frequency of the electric waves to be absorbed by the electric-wave absorber due to the protective layer 4 can be canceled out, and electric waves of the desired frequency are favorably absorbed by the electric-wave absorbing sheet on which the protective layer 4 is formed. The thickness reduction rate, which is the degree to which the thickness of the dielectric layer 2 is reduced, will be described below. Note that in the following description, the thickness reduction rate, which is the degree to which the thickness of the dielectric layer 2 is reduced, is expressed as T. Since the thickness reduction rate T is the degree of reduction of the thickness of the dielectric layer 2 from the reference thickness dst, the value of T being large indicates that the dielectric layer 2 is thinner as a result, and the value of T being smaller indicates that the dielectric layer 2 is thicker.

The inventors thought that the frequency peak shift of the absorption electric waves caused by the provision of the protective layer 4 occurs due to the influence of the permittivity and the thickness of the protective layer 4 when the incident electric waves pass therethrough, as a result of the protective layer 4 made of a dielectric material being stacked on the electric resistance film 3. In view of this, in an electric-wave absorbing sheet having two dielectric layers, namely a protective layer 4 and a dielectric layer 2, a simulation was performed in which the absorption ratio of electric waves of frequencies in and above the millimeter-wave band is obtained, and the appropriate thickness of the dielectric layer 2 for absorbing electric waves of a predetermined frequency is obtained, and thus a thickness reduction rate T, which is the degree of reduction from the reference thickness dst, which is the preferable thickness of the dielectric layer 2 when the protective layer 4 is not considered, was calculated.

<Details of Simulation>

The simulation was performed with electric waves considered as plane waves propagating in a Z (axis) positive direction and a Z (axis) negative direction, and with these plane waves having a propagation constant of y and a wave impedance of Z when propagating through a medium with a uniform permittivity c and a uniform magnetic permeability μ. Note that it was assumed that both waves propagating in the Z-positive direction and waves propagating in the Z-negative direction exist at the same time, and that the electromagnetic field at each position in the Z direction is a composite of an electric field component and a magnetic field component.

At this time, if $E_1$ is the electric field component of the plane wave at Z=d, $H_1$ is the magnetic field component of the plane wave at Z=d, $E_2$ is the electric field component of the plane wave at Z=0, and $H_2$ is the magnetic field component of the plane wave at Z=0, the basic matrix formula (1) is as follows.

[Math 1]

$$\begin{pmatrix} E_2 \\ H_2 \end{pmatrix} = \begin{pmatrix} \cosh \gamma d & Z \sinh \gamma d \\ \frac{1}{Z} \sinh \gamma d & \cosh \gamma d \end{pmatrix} \begin{pmatrix} E_1 \\ H_1 \end{pmatrix} \quad (1)$$

Figure 2:
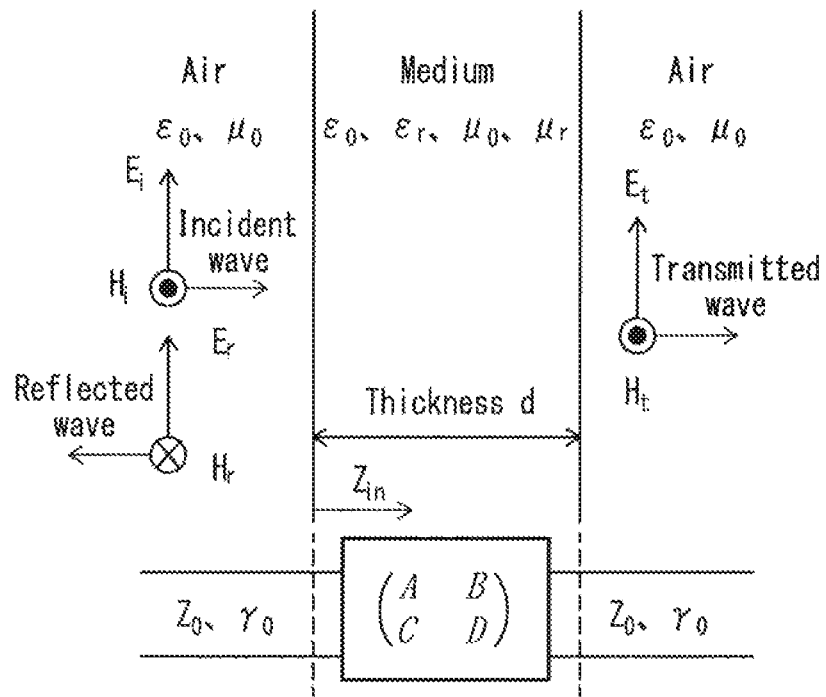
FIG. 2 is a diagram illustrating a principle of simulation for obtaining a thickness reduction rate of the electric-wave absorbing sheet.
Figure 2:
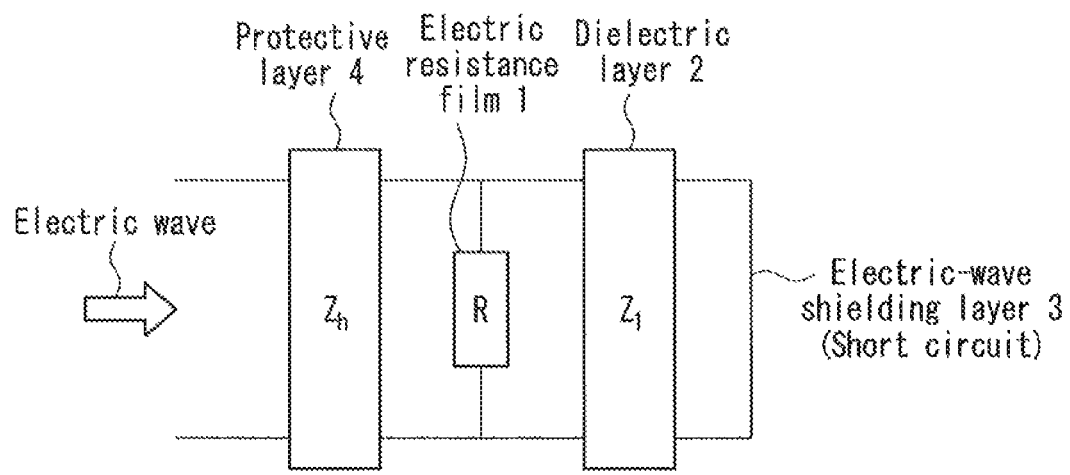

FIG. 2 is a diagram illustrating the concept of the simulation used in this embodiment. FIG. 2(a) shows a state in which a plane wave is incident on a medium with a thickness d, and FIG. 2(b) shows an equivalent circuit of an electric-wave absorbing sheet in which a protective layer made of a dielectric is formed on an electric resistance film.

As shown in FIG. 2(a), in the simulation used in this embodiment, a state is handled in which an electric wave is incident (incident wave) on a medium of the thickness d from the left side in the diagram, and part of it passes through the medium (transmitted wave). A reflected wave reflected by the incident surface to the medium is also taken into consideration.

Note that the incident surface side of the medium (left side in FIG. 2(a)) can be considered as Z=0, and the exit surface side of the passing electric wave (right side in FIG. 2(a)) can be considered as Z=d, and if the electric field on the incident surface side (Z=0 side) is $E_2$, the magnetic field is $H_2$, the electric field on the exit surface side (Z=d side) is $E_1$, and the magnetic field is $H_1$, then the medium region can be expressed as the matrix shown in the following formula (2) based on the basic matrix formula (1). Note that, as shown in FIG. 2(a), the electric field and the magnetic field on the incident surface side are the sum of the incident wave and the reflected wave, and the electric field and magnetic field on the exit surface side result from the transmitted wave.

[Math 2]

$$\begin{pmatrix} A & B \\ C & D \end{pmatrix} = \begin{pmatrix} \cosh \gamma d & Z \sinh \gamma d \\ \frac{1}{Z} \sinh \gamma d & \cosh \gamma d \end{pmatrix} \quad (2)$$

In this case, the input impedance $Z_{in}$ as viewed from the incident surface side of the medium can be expressed by the following formula (3) using $E_1 = Z_0 * H_1$. Also, the vacuum impedance (which is considered to be the same in the air) $Z_0$ is given by the following equation (4) using the permittivity co and the magnetic permeability $\mu_0$ in a vacuum.

[Math 3]

$$Z_{in} = \frac{E_2}{H_2} = \frac{A*E_1 + B*H_1}{C*E_1 + D*H_1} = \frac{A + B/Z_0}{C + D/Z_0} \quad (3)$$

$$Z_0 = \sqrt{\frac{\mu_0}{\varepsilon_0}} = 377 \cong 376.7 \quad (4)$$

As shown in FIG. 1, in the configuration of the electric-wave absorbing sheet according to the present embodiment, a protective layer 4 made of a dielectric, an electric resistance film 1 that is an electric resistance layer, a dielectric layer 2, and an electric-wave shielding layer 3, which can be understood as a metal layer, are sequentially stacked in order starting from the electromagnetic-wave incident surface side. FIG. 2(b) shows the configuration of this electric-wave absorbing sheet as an equivalent circuit.

The input impedance of the entire electric-wave absorbing sheet at this time is expressed by formula (5). Note that the protective layer 4 is represented by a matrix formula using Ah, Bh, Ch, and Dh.

[Math 4]

$$\begin{pmatrix} E_z \\ H_z \end{pmatrix} = \begin{pmatrix} A_h & B_h \\ C_h & D_h \end{pmatrix} \begin{pmatrix} 1 & 1 \\ 1/R & 1 \end{pmatrix} \begin{pmatrix} A & B \\ C & D \end{pmatrix} \begin{pmatrix} 0 \\ H_1 \end{pmatrix} \quad (5)$$

Accordingly, the input impedance from the electromagnetic-wave incidence side of the entire electric-wave absorbing sheet can be expressed by the following formula (6).

[Math 5]

$$\begin{pmatrix} E \\ H \end{pmatrix} = \begin{pmatrix} A & B \\ C & D \end{pmatrix} \begin{pmatrix} 0 \\ H_1 \end{pmatrix} \quad (6)$$

Here, the return loss, which is the degree of reduction of the reflected waves with respect to the incident waves, is represented by $\Gamma$, and formula (6) is converted into the following formula (7).

[Math 6]

$$\begin{pmatrix} E(1+\Gamma) \\ H/Z_0(1-\Gamma) \end{pmatrix} = \begin{pmatrix} B \\ D \end{pmatrix} H_1 \quad (7)$$

By transforming this, $E(1+\Gamma) = BH_1$ and $E(1-\Gamma) = Z_0 D H_1$ hold true, and the reflection attenuation rate F is obtained as shown in formula (9) below.

[Math 7]

$$\frac{1+\Gamma}{1-\Gamma} = \frac{B}{Z_0 D} \quad (8)$$

$$\Gamma = \frac{\frac{B}{D} - Z_0}{\frac{B}{D} + Z_0} \quad (9)$$

Note that in the present embodiment, the return loss RL serving as an evaluation value of the electric-wave absorbing properties of the electric-wave absorbing sheet is expressed in decibels using the reflection attenuation rate F as shown in formula (10) below.

[Math 8]

$$RL \text{ (dB)} = 20 * \log_{10}(|\Gamma|) \quad (10)$$

<Thickness Reduction Rate of Dielectric Layer>

Using the above-described simulation, the return loss of the incident electric waves in the electric-wave absorbing sheet obtained by forming the protective layer on the electric resistance film was obtained, and the thickness of the dielectric layer that can absorb electric waves favorably when electric waves of the predetermined frequency are incident on the electric-wave absorbing sheet on which the protective layer is formed was calculated.

Note that the "range in which electric waves are favorably absorbed" is defined as a range in which the return loss is 10 dB or more, that is, the ratio of the reflected waves to the incident waves is 1/10 or less. This is because it is conceivable that if an electric-wave absorber or electric-wave absorbing sheet can reduce unwanted electric waves to 1/10 or less, the effect thereof will be recognized.

In addition, the permittivity of the protective layer was in the range of 2 or more and 20 or less, considering that the permittivity of the polyethylene terephthalate exemplified above is 2.7, and considering the permittivity of various other materials that can be used as the protective layer. On the other hand, the film thickness of the protective layer was set to a range of 10 μm or more and 150 μm or less, considering the functional aspect of a thickness that can protect the electric resistance film, the viewpoint of not significantly impairing the overall flexibility of the sheet, which is particularly required in the case of an electric-wave absorbing sheet, and manufacturing conditions such as ease of manufacture.

The permittivity of the dielectric layer was considered to be in the range of 2 or more and 8 or less, considering the dielectric layer containing dielectric materials such as titanium oxide, polyvinylidene fluoride, polyester resin, polyolefin resin, glass, and silicone rubber, which were described above.

In the simulation, regarding the return loss when electric waves of a specific frequency are incident on an electric-wave absorbing sheet having a protective layer, minimum and maximum values of the thickness dcal of the dielectric layer at which the return loss is 10 dB or more were obtained by varying the permittivity of the protective layer in a range of 2 or more and 20 or less, varying the thickness of the protective layer in a range of 10 μm or more and 150 μm or less, and varying the permittivity of the dielectric layer in the range of 2 or more and 8 or less. Then, the thickness reduction rate T(%), (T=((dst−dcal)/dst)×100) with respect to the reference thickness dst obtained using the calculation formula $d=\lambda/4(\varepsilon r)^{-1/2}$ when the thickness of the dielectric layer obtained based on the frequency of the incident electric waves without a protective layer, that is, the permittivity of the dielectric layer, is εr was obtained.

Note that when actually manufactured as an electric-wave absorbing sheet, the range in which the electric-wave absorbing properties can be sufficiently ensured was set such that the peak frequency of the electric waves that are to actually be absorbed by the electric-wave absorbing sheet are reduced by +5% with respect to the frequency of the incident electric waves, which was set from the beginning.

<Change in Thickness Reduction Rate of Dielectric Layer Due to Frequency of Absorption Electric Waves>

Figure 3:
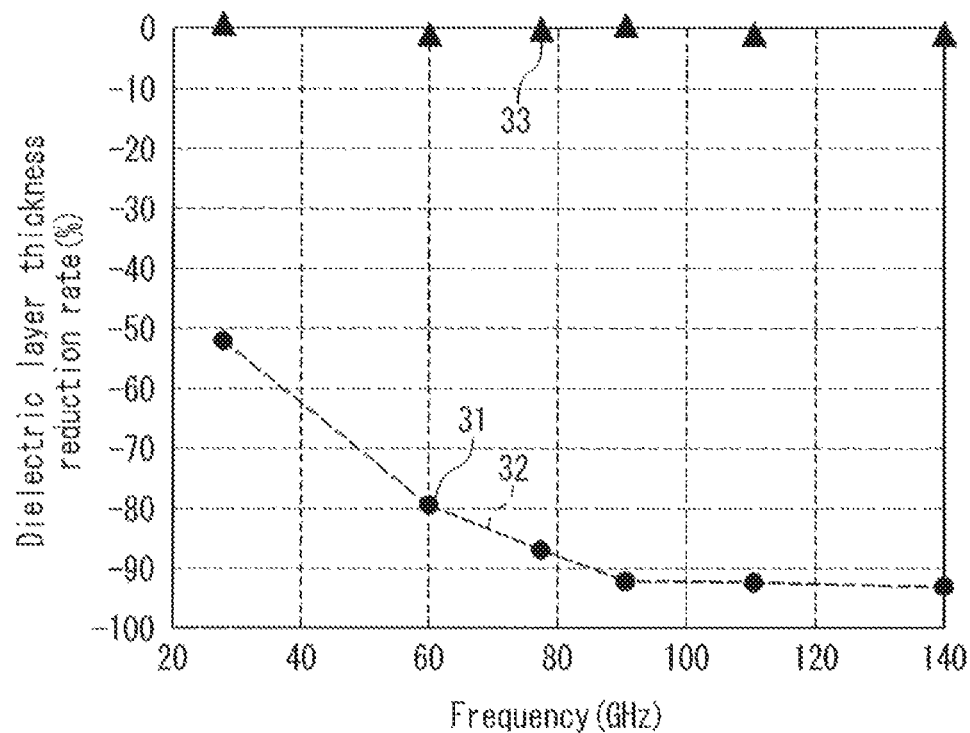
FIG. 3 is a diagram showing a relationship between a frequency of absorption electric waves and the thickness reduction rate of a dielectric layer when the frequency is 28.5 GHz or more and 140 GHz or less.
Figure 4:
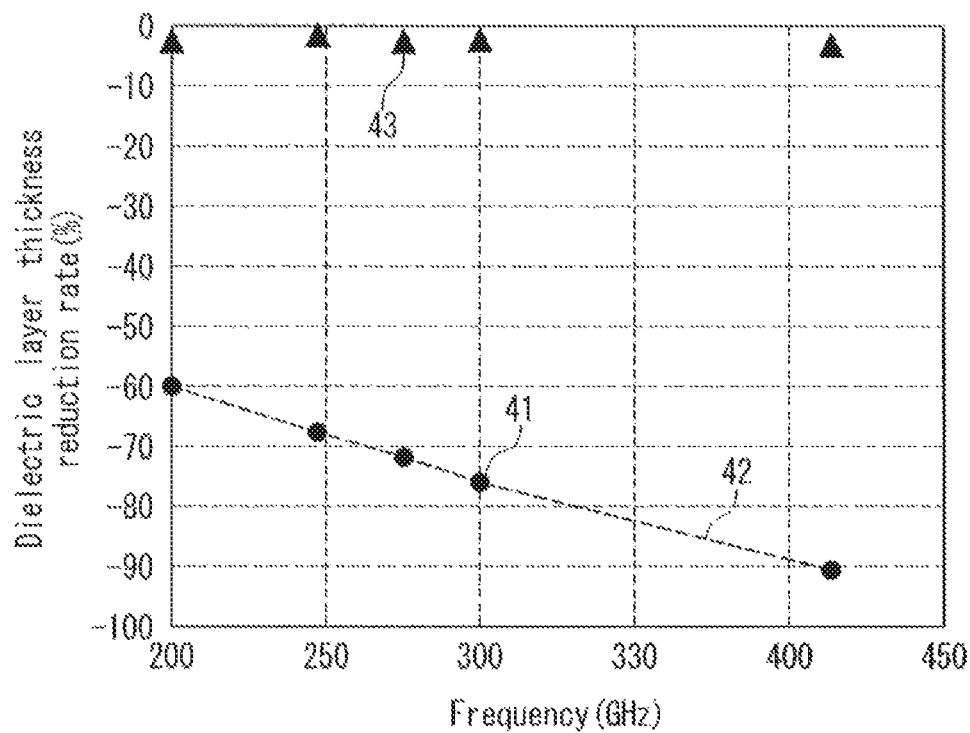
FIG. 4 is a diagram showing a relationship between a frequency of absorption electric waves and the thickness reduction rate of the dielectric layer when the frequency is 200 GHz or more and 414 GHz or less.

Using the above simulation, the inventors confirmed the change in the thickness reduction rate T of the dielectric layer while varying the frequency of the electric waves to be absorbed. FIGS. 3 and 4 show changes in the range of the thickness reduction rate T of the dielectric layer with respect to the frequency of absorption electric waves.

FIG. 3 shows the range of the thickness reduction rate of the dielectric layer for electric waves with a frequency of 28.5 GHz or more and 140 GHz or less.

In FIG. 3, a black circle mark indicated by reference numeral 31 indicates the state where the thickness reduction rate T of the dielectric layer is at the maximum, that is, the value of the thickness reduction rate when the thickness dcal of the dielectric layer obtained through calculation is the thinnest. Also, a black triangle mark indicated by reference numeral 33 indicates a case where the value of the thickness dcal obtained through calculation is the thickest and the thickness reduction rate T from the reference thickness dst, which is set without considering the protective layer, is small.

As shown in FIG. 3, the dashed line 32 indicating the change in the maximum value of the thickness reduction rate T has different rates of change in the thickness reduction rate T in the ranges of 28.5 GHz to 60 GHz, 60 GHz to 90 GHz, and 90 GHz to 140 GHz. Specifically, when the frequency of the absorption electric waves is in the range of 28.5 GHz to 60 GHz, the thickness reduction rate T changes to a large value with a relatively large slope, and when the frequency of the absorption electric waves is in the range of 60 GHz to 90 GHz, the value of the thickness reduction rate T becomes larger, but the slope of the dashed line 32 indicating the degree of change becomes smaller. Furthermore, when the frequency of the absorption electric waves is in the range of 90 GHz to 140 GHz, the value of the thickness reduction rate T is almost constant at a large value of about 92%. In other words, as the frequency range increases, the thickness reduction rate T changes less.

On the other hand, the black triangle mark indicated by reference numeral 33 indicates the case where the value of the thickness dcal obtained through calculation is the largest and the thickness reduction rate T from the reference thickness dst set without considering the protective layer is the minimum value. The value of the thickness reduction rate T in this case is approximately 0.1% to approximately 1.5% over the entire frequency range of 28.5 GHz to 90 GHz.

Next, the inventors confirmed the change in the thickness reduction rate T of the dielectric layer when the frequency range of the electric waves incident on the electric-wave absorbing sheet is higher, at 200 GHz or more and 414 GHz or less. It should be noted that the range in which the frequency of incident electric waves exceeds 140 GHz and is lower than 200 GHz is extremely rarely used in actuality from the viewpoint of atmospheric attenuation of electric waves and the like, and it is thought that there is little demand for an electric-wave absorbing sheet that absorbs electric waves in this frequency range, and therefore no studies were conducted on the thickness reduction rate T of the specific dielectric layer in this embodiment.

FIG. 4 shows the range of the thickness reduction rate of the dielectric layer for electric waves with a frequency of 200 GHz or more and 414 GHz or less.

In FIG. 4, the maximum value of the thickness reduction rate T of the dielectric layer indicated by the black circle mark (reference numeral 41) increases from about 60% to about 91% (line 42) as the frequency of the electric waves increases. On the other hand, at the minimum value of the thickness reduction rate T of the dielectric layer indicated by the black triangle mark (reference numeral 43), even though the frequency of the electric waves increases, the change is small, and the value is between about 1.5% and about 3.2%.

In this manner, when the frequency of the electric waves incident on and absorbed by the electric-wave absorbing sheet is 200 GHz or more and 414 GHz or less, the maximum value of the thickness reduction rate T of the dielectric layer increases as the frequency of the incident electric waves increases. Also, it can be understood that the minimum value of the thickness reduction rate T of the dielectric layer is slightly larger than that in the case where the frequency is 28.5 GHz or more and 140 GHz or less, which is shown in FIG. 3, that is, the degree of reduction from the reference thickness is larger.

As shown in FIGS. 3 and 4 above, it was confirmed that the trend of the change in the thickness reduction rate T of the dielectric layer corresponding to the frequency of the incident electric waves changes in each of four ranges, namely (1) the range in which the frequency of the electric waves to be absorbed is 28.5 GHz or more and 60 GHz or less, (2) the range in which the frequency of the electric waves to be absorbed exceeds 60 GHz and is not more than 90 GHz, (3) the range in which the frequency of the electric waves to be absorbed exceeds 90 GHz and is not more than 140 GHz, and (4) the range in which the frequency of the electric waves to be absorbed is 200 GHz or more and 414 GHz or less. For this reason, in order to obtain a more preferable thickness of the dielectric layer with consideration given to the influence of the protective layer, it is effective to first divide the frequencies of the electric waves to be absorbed into the above four frequency ranges (1) to (4), and then obtain a preferable thickness reduction rate T corresponding to the permittivity of the material used for the dielectric layer in each frequency range. The contents thereof will be described below.

<Relationship Between Permittivity of Dielectric Layer and Thickness Reduction Rate of Dielectric Layer According to Frequency Range of Incident Electric Waves>

Figure 5:
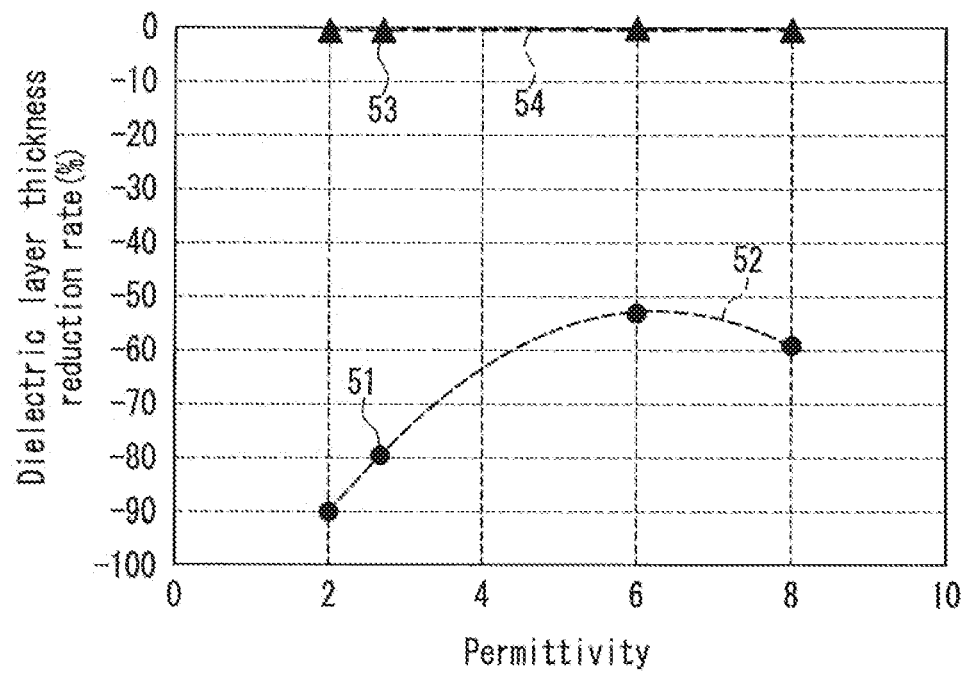
FIG. 5 is a diagram showing a relationship between a permittivity D of the dielectric layer and the thickness reduction rate T of the dielectric layer when the frequency is 28.5 GHz or more and 60 GHz or less.

FIG. 5 is a graph showing the relationship between the permittivity and the thickness reduction rate of a dielectric layer for electric waves with a frequency of 28.5 GHz or more and 60 GHz or less.

In FIG. 5, the black circle mark indicated by reference numeral 51 is the maximum value (Tmax) of the thickness reduction rate T of the dielectric layer, and is expressed by the formula "$-0.021 \times D^2 40.26 \times D - 1.35$" (formula 1: reference numeral 52) in the range where the permittivity D of the dielectric layer is 2 or more and 8 or less. On the other hand, in FIG. 5, the black triangle mark indicated by reference numeral 53 is the minimum value (Tmin) of the thickness reduction rate T of the dielectric layer, and is expressed by the formula "$-0.0005 \times D^2 + 0.0056 \times D - 0.017$" (formula 2: reference numeral 54) in the range where the permittivity D of the dielectric layer is 2 or more and 8 or less.

These formulas 1 and 2 were calculated using the method of least squares based on each point shown in FIG. 5 (black circle mark: reference numeral 51, black triangle mark: reference numeral 53). Note that $R^2$ obtained by squaring the correlation coefficient R was 0.99 or more. Note that formulas 3 to 8 shown below were also calculated in the same manner.

According to the above description, when the frequency of the electric waves to be absorbed is 28.5 GHz or more and 60 GHz or less, electric waves can be favorably absorbed with the reflection attenuation rate of the electric waves at a level of 10 dB or more, by using the dielectric layer with a thickness reduction rate T in a range between formulas (1) and (2) described above, with consideration given to the thickness of the dielectric layer and the permittivity of the material to be used in the dielectric layer, with respect to the reference thickness dst of the dielectric layer obtained based on the frequency of the incident electric waves and the permittivity of the material to be used as the dielectric layer.

Figure 6:
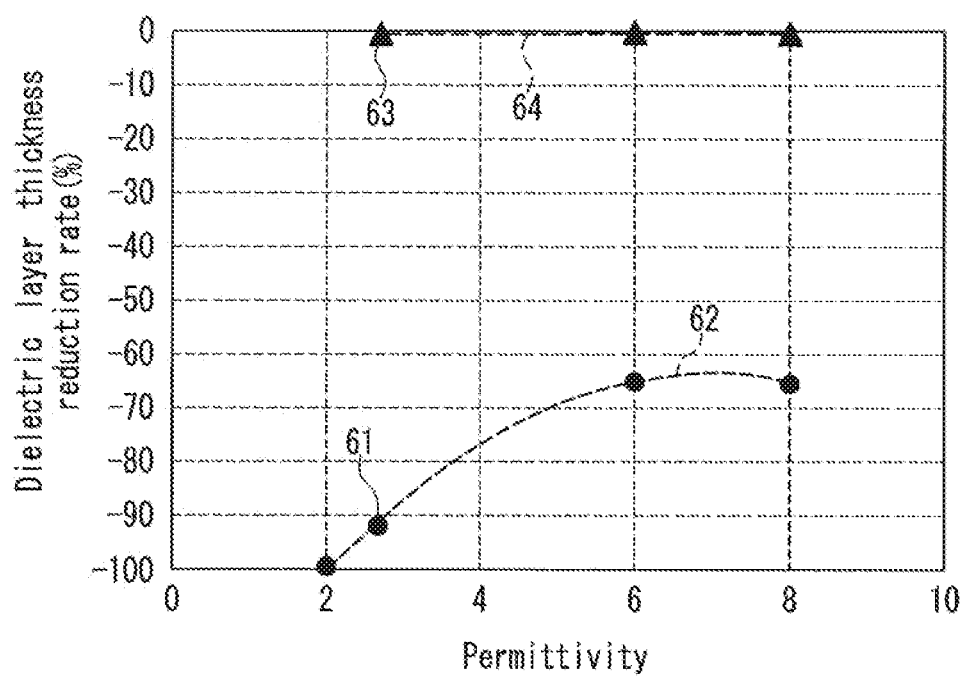
FIG. 6 is a diagram showing a relationship between the permittivity D of the dielectric layer and the thickness reduction rate T of the dielectric layer when the frequency is greater than 60 GHz and less than or equal to 90 GHz.

FIG. 6 is a graph showing the relationship between the permittivity and the thickness reduction rate of the dielectric layer for electric waves with frequencies that exceed 60 GHz and are not more than 90 GHz.

Figure 7:
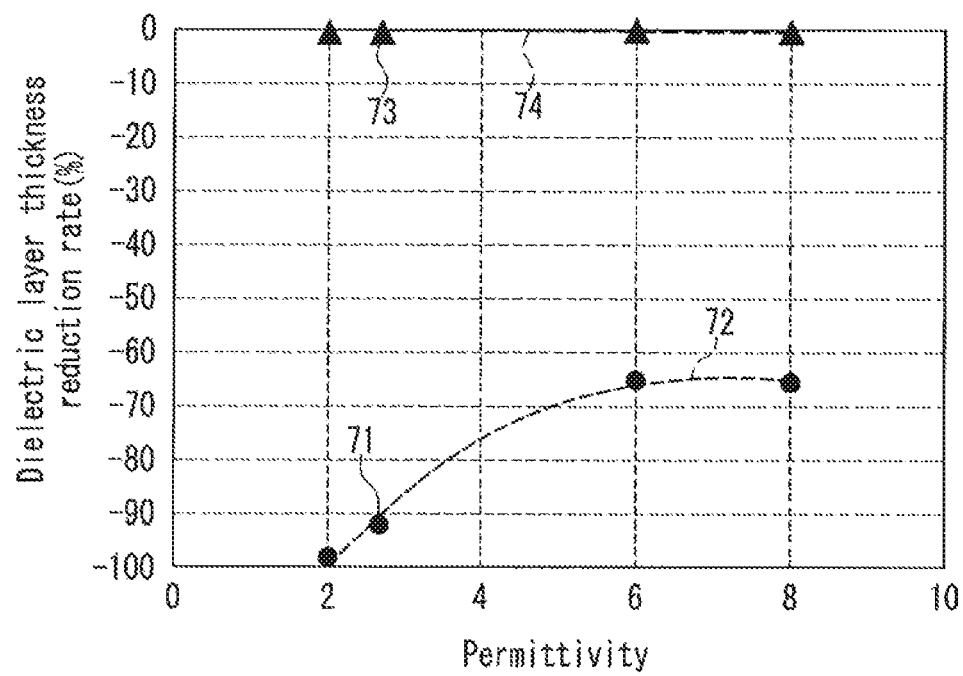
FIG. 7 is a diagram showing a relationship between the permittivity D of the dielectric layer and the thickness reduction rate T of the dielectric layer when the frequency is greater than 90 GHz and less than or equal to 140 GHz.

Also, FIG. 7 is a graph showing the relationship between the permittivity and the thickness reduction rate of the dielectric layer for electric waves with a frequency that exceeds 90 GHz and is not more than 140 GHz.

Figure 8:
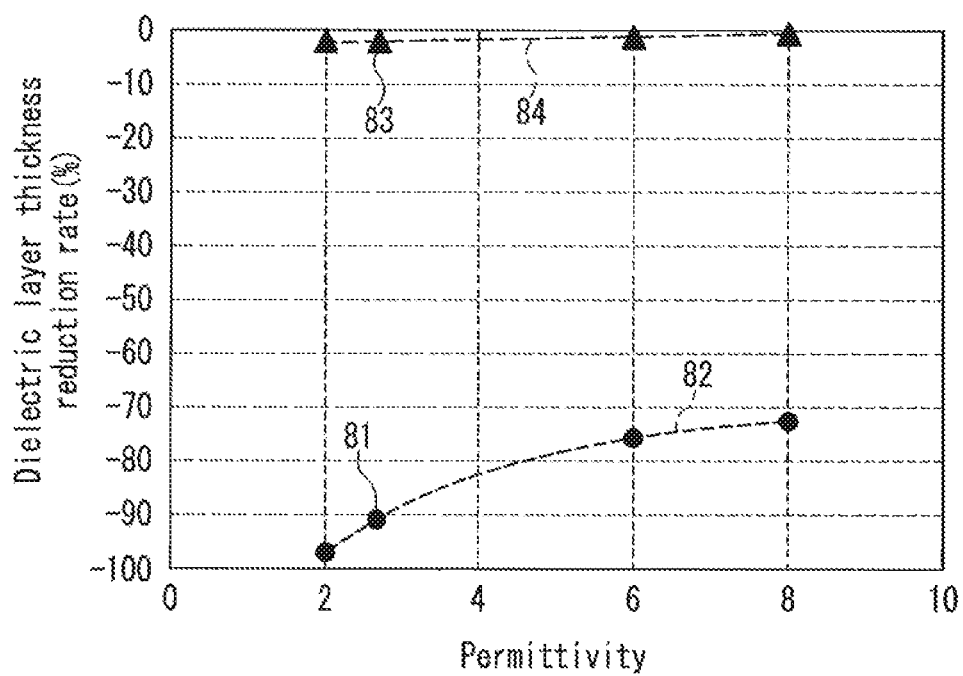
FIG. 8 is a diagram showing the relationship between the permittivity D of the dielectric layer and the thickness reduction rate T of the dielectric layer when the frequency is 200 GHz or more and 414 GHz or less.

Furthermore, FIG. 8 is a graph showing the relationship between the permittivity and the thickness reduction rate of the dielectric layer for electric waves with a frequency of 200 GHz or more and 420 GHz or less.

In FIG. 6, the black circle mark indicated by reference numeral 61 is the maximum value (Tmax) of the thickness reduction rate T of the dielectric layer, and is expressed by the formula "$-0.014 \times D^2 + 0.20 \times D - 1.33$" (formula 3: reference numeral 62) in the range where the permittivity D of the dielectric layer is 2 or more and 8 or less. On the other hand, in FIG. 6, the black triangle mark indicated by reference numeral 63 is the minimum value (Tmin) of the thickness reduction rate T of the dielectric layer, and is expressed by the formula "$-0.0002 \times D^2 - 0.0029 \times D + 0.008$" (formula 4: reference numeral 64) in the range where the permittivity D of the dielectric layer is 2 or more and 8 or less.

In a case where the electric waves have a frequency that exceeds 60 GHz and is not more than 90 GHz as in FIG. 5 when the frequency of the electric waves to be absorbed is 28.5 GHz or more and 60 GHz or less, electric waves can be favorably absorbed with the reflection attenuation rate of the electric waves at a level of 10 dB or more, by using the dielectric layer with a thickness reduction rate T in a range between formulas (3) and (4) described above, with consideration given to the thickness of the dielectric layer and the permittivity of the material to be used in the dielectric layer, with respect to the reference thickness dst of the dielectric layer obtained based on the frequency of the incident electric waves and the permittivity of the material to be used as the dielectric layer.

Similarly, when the frequency of the incident electric waves exceeds 90 GHz and is not more than 140 GHz, as shown in FIG. 7, the black circle mark indicated by reference numeral 71 is the maximum value (Tmax) of the thickness reduction rate T of the dielectric layer, and is expressed by the formula "$-0.013 \times D^2 + 0.19 \times D - 1.32$" (formula 5: reference numeral 72) in the range where the permittivity D of the dielectric layer is 2 or more and 8 or less. On the other hand, in FIG. 7, the black triangle mark indicated by reference numeral 73 is the minimum value (Tmin) of the thickness reduction rate T of the dielectric layer, and is expressed by the formula "$-0.0003 \times D^2 + 0.0017 \times D - 0.0024$" (formula 6: reference numeral 74) in the range where the permittivity D of the dielectric layer is 2 or more and 8 or less.

Furthermore, in FIG. 8, which shows the case where the frequency of the incident electric waves is 200 GHz or more and 4140 GHz or less, the black circle mark indicated by reference numeral 81 is the maximum value (Tmax) of the thickness reduction rate T of the dielectric layer, and is expressed by the formula "$-0.0060 \times D^4 + 0.099 \times D - 1.13$" (formula 7; reference numeral 82) in the range where the permittivity D of the dielectric layer is 2 or more and 8 or less. On the other hand, in FIG. 8, the black triangle mark indicated by reference numeral 83 is the minimum value (Tmin) of the thickness reduction rate T of the dielectric layer, and is expressed by the formula "$-0.0001 \times D^2 + 8 \times 10^{-5} \times D - 0.017$" (formula 8: reference numeral 84) in the range where the permittivity D of the dielectric layer is 2 or more and 8 or less.

Thus, in the electric-wave absorbing sheet shown in this embodiment, considering that the protective layer having a permittivity of 2 to 20 and a thickness of 10 to 150 μm is formed, the thickness of the dielectric layer is the thickness deal reduced using a predetermined thickness reduction rate T with respect to the reference thickness dst of the dielectric layer obtained based on the permittivity of the material used in the dielectric layer and the frequency of the electric waves to be absorbed. By doing so, it is possible to realize an electric-wave absorbing sheet that favorably absorbs predetermined electric waves while considering the influence of the protective layer.

Note that, as described above, in the electric-wave absorbing sheet of the present embodiment, the thickness reduction rate T of the dielectric layer with consideration given to the protective layer can be obtained based on the frequency of the electric waves to be absorbed and the permittivity of the material used for the dielectric layer. For this reason, it is possible to set a more preferable thickness of the dielectric layer using only the same information as in the case of calculating the conventional reference thickness dst, that is, the frequency of the absorption electric waves and the permittivity of the dielectric layer, and an electric-wave absorbing sheet having a favorable electric-wave absorbing properties can be easily obtained.

Specific Example

Next, a specific example of actually producing an electric-wave absorbing sheet will be described.

As described above, the electric-wave absorber disclosed in the present application is characterized in that the thickness of the dielectric layer is reduced by a predetermined thickness reduction rate T from the reference thickness dst with consideration given to the influence of the protective layer. Similarly, the method of manufacturing an electric-wave absorber disclosed in the present application is characterized in that a preferable thickness of the dielectric layer obtained with consideration given to the influence of the protective layer is calculated.

First, when forming the electric resistance film, an electric resistance film liquid was prepared by adding the following components and mixing them together.

(1) Conductive polymer dispersion 36.7 parts
 Conductive polymer manufactured by Heraeus Corporation (PEDOT-PSS) PH-1000 (product name),
 Solid content concentration: 1.2 mass %
(2) PVDF dispersion 5.6 parts
 LATEX32 (product name) manufactured by Arkema Corporation
 Solid content concentration: 20 mass %, solvent: water
(3) Water-soluble polyester aqueous solution 0.6 parts
 PLAS COAT Z561 (product name) manufactured by Goo Chemical Co., Ltd.
 Solid content concentration: 25 mass %
(4) Organic solvent (dimethyl sulfoxide) 9.9 parts
(5) Water-soluble solvent (ethanol) 30.0 parts
(6) Water 17.2 parts The electric resistance film liquid prepared above was applied on a polyethylene terephthalate base having a thickness of 50 μm through bar coating, and then heated at 150° C. for 5 minutes to form a film.

Thereafter, a 110 μm-thick silicone OCA manufactured by Nichiei Shinka Co., Ltd. was adhered to the surface of the base opposite to the side on which the electric resistance film layer of polyethylene terephthalate was applied. Also, the electric-wave shielding layer was formed using a conductive mesh Su-4X-13227 (product name) manufactured by Seiren Co., Ltd.

Here, as described above, the thickness of the dielectric layer is determined based on the frequency of the electric waves to be absorbed by the electric-wave absorbing sheet to be produced and the permittivity of polyethylene terephthalate forming the dielectric layer.

In this embodiment, the frequency of electric waves to be absorbed is 414 GHz. The material used for the dielectric layer is silicone OCA with a permittivity D of 2.7. Also, the permittivity of polyethylene terephthalate used as the protective layer is 3.3, and the thickness of the protective layer is 50 μm.

First, the reference thickness dst of the dielectric layer obtained through the conventional dielectric layer thickness determination method in which the protective layer is not considered is 110 μm, based on $d=\lambda/4(\varepsilon r)^{-1/2}$.

Since the frequency of the incident electric waves is 414 GHz, when the thickness reduction rate T of the dielectric layer is obtained based on FIG. 8, the permittivity of the protective layer is 3.3, and therefore the thickness reduction rate is between the maximum value (max)−93% and the minimum value (min)−1.6%, and −60.9% was selected as an example.

As a result, the thickness deal of the dielectric layer with consideration given to the thickness reduction rate T is 43 μm, which is dst×(100−60.9), and the application thickness of the material, pressing conditions, drying conditions, and the like are determined such that the dielectric layer is 43 μm.

After the electric-wave absorbing sheet was produced as described above, a 50 μm-thick polyethylene terephthalate sheet provided with an adhesive layer was adhered as a protective layer on the surface of the electric resistance film of the electric-wave absorbing sheet to obtain the electric-wave absorbing sheet of the example.

(Measurement of Electric-Wave Absorbing Properties)

The electric-wave absorbing properties of the electric-wave absorbing sheet produced above was measured using THZ-TDS TAS7500SP (product name) manufactured by Advantest Co., Ltd. As for the electric-wave absorbing properties, the attenuation amount of the reflected waves with respect to the incident waves was obtained as the return loss and expressed in dB, as in the simulation results described above.

In the case of the electric-wave absorbing sheet of the above example, the peak of the electric wave absorption amount at a frequency of 414 GHz was 20 dB, and a high electric wave absorption amount of 99% or more was achieved.

Note that in the electric-wave absorbing sheet produced as an example, as a result of a sliding test performed by setting a white knell cloth on a sliding test machine manufactured by HEIDON Co., Ltd., under the conditions of an added weight of 2000 g, a sliding speed of 4500 mm/min, a sliding width of 25 mm, and 1000 sliding passes (about 10 minutes), it was confirmed that by providing a protective layer with a thickness of 50 μm, the surface electric resistance can be maintained without scratching the surface of the electric resistance film even when the surface of the electric-wave absorbing sheet is rubbed, and the protective layer itself can sufficiently withstand such friction.

In addition, upon conducting a flexibility test in which the electric-wave absorbing sheet prepared as the above example is placed on a horizontally-arranged aluminum cylindrical rod (mandrel) with a diameter of 6 mm so that the protective layer side faces up, a weight of 300 g is applied to both ends of the sheet, and this is maintained for 30 seconds, there was no change in the appearance of the sheet surface or the surface electric resistance after the test, and there was no change in the electric-wave absorption properties. From this, it was confirmed that the electric-wave absorbing sheet of the above example had high flexibility.

As described above, the electric-wave absorbing sheet according to the present embodiment is an electric-wave interference type electric-wave absorbing sheet in which an electric resistance film, a dielectric layer, and an electric-wave shielding layer are stacked, and a protective layer is provided on the surface of the electric resistance film. For this reason, for example, even when a conductive polymer film is used as an electric resistance film to form a flexible electric-wave absorbing sheet, it is possible to prevent the surface electric resistance of the electric resistance film from changing due to the protective layer. Furthermore, it is possible to realize an electric-wave absorbing sheet having high electric-wave absorption properties by using, as the thickness of the dielectric layer, a thickness dcal obtained with consideration given to a predetermined thickness reduction rate determined according to the frequency of the absorption electric waves and the permittivity of the dielectric layer from a reference thickness dst calculated based on the frequency of the electric waves and only the permittivity, in response to a frequency shift of the absorption electric waves of the electric-wave absorbing sheet, which is caused by having a protective layer with a permittivity of 2 to 20 and a thickness of 10 to 150 μm.

The electric-wave absorbing sheet disclosed in the present application can be realized as a flexible electric-wave absorbing sheet that has stable and high electric-wave absorption properties, and can maintain the electric-wave absorption properties even when the electric-wave absorbing sheet is strongly bent, due to the electric resistance film being constituted by a conductive organic polymer.

In addition, even when realized as an electric-wave absorber having a predetermined thickness with respect to the surface area, if the electric-wave absorber can be flexible as a whole, the handling property when arranging the electric-wave absorber at a predetermined position can be improved, and an electric-wave absorber with high practical usability can be obtained.

Furthermore, for example, in the case of electric-wave absorbers to be arranged side by side in a tile shape, by using a configuration that has light transmittance as a whole as described above, the electric-wave absorber can be arranged on a window or a transparent wall and an electric-wave absorption block whose opposite side can be seen through can be obtained. Even in this case, high electric-wave absorbing properties can be realized by forming a stack of the electric resistance film and the protective layer to match the impedance in the air.

INDUSTRIAL APPLICABILITY

The electric-wave absorber disclosed in the present application is useful as an electric-wave absorber of an electric-wave interference type that can stably exhibit high electric-wave absorbing properties by having a protective layer on its surface. Also, the manufacturing method for an electric-wave absorber disclosed in the present application is useful in manufacturing an electric-wave absorber that has a protective layer and has excellent electric-wave absorbing properties, with consideration given to a frequency shift of absorption electric waves caused by the protective layer.

DESCRIPTION OF REFERENCE NUMERALS

1 Electric resistance film
2 Dielectric layer
3 Electric-wave shielding layer
4 Protective layer
5 Adhesive layer
dst Reference thickness of dielectric layer
T Thickness reduction rate of dielectric layer
dcal Thickness of dielectric layer with consideration given to thickness reduction rate T

The invention claimed is:
1. An electric-wave absorber of an electric-wave interference type comprising an electric resistance film, a dielectric layer, and an electric-wave shielding layer that are sequentially stacked on each other,
wherein absorption electric waves to be absorbed by the electric-wave absorber are electric waves in a high frequency band in or above a millimeter-wave band,
the electric-wave absorber further comprises a protective layer on the electric resistance film,
the protective layer has a permittivity of 2 or more and 20 or less, and a thickness of 10 μm or more and 150 μm or less, and a permittivity D of the dielectric layer is 2 or more and 8 or less, and
a thickness of the dielectric layer is smaller than a reference thickness dst determined according to the frequency of the absorption electric waves and the permittivity of the dielectric layer, and satisfies any one of the following conditions 1) to 4)
1) In a case where the frequency of the absorption electric waves is 28.5 GHz or more and 60 GHz or less, the value of a reduction rate T of the thickness of the dielectric layer from the reference thickness dst is a value between a curve represented by (Formula 1) below and a curve represented by (Formula 2) below with respect to the permittivity D of the dielectric layer, and deviation of a maximum absorption frequency of the electric waves that are to actually be absorbed by the electric-wave absorber from the frequency of the absorption electric waves is within ±5%

$$T\max = -0.021 \times D^2 + 0.26 \times D - 1.35 \quad \text{(Formula 1)}$$

$$T\min = -0.0005 \times D^2 + 0.0056 \times D - 0.017 \quad \text{(Formula 2)}$$

2) In a case where the frequency of the absorption electric waves is greater than 60 GHz and not more than 90 GHz, the value of a reduction rate T of the thickness of the dielectric layer from the reference thickness dst is a value between a curve represented by (Formula 3) below and a curve represented by (Formula 4) below with respect to the permittivity D of the dielectric layer, and deviation of a maximum absorption frequency of the electric waves that are to actually be absorbed by the electric-wave absorber from the frequency of the absorption electric waves is within ±5%

$$T\max = -0.014 \times D^2 + 0.20 \times D - 1.33 \quad \text{(Formula 3)}$$

$$T\min = -0.0002 \times D^2 - 0.0029 \times D + 0.008 \quad \text{(Formula 4)}$$

3) In a case where the frequency of the absorption electric waves is greater than 90 GHz and not more than 140 GHz, the value of a reduction rate T of the thickness of the dielectric layer from the reference thickness dst is a value between a curve represented by (Formula 5) below and a curve represented by (Formula 6) below with respect to the permittivity D of the dielectric layer, and deviation of a maximum absorption frequency of the electric waves that are to actually be absorbed by the electric-wave absorber from the frequency of the absorption electric waves is within ±5%

$$T\max = -0.013 \times D^2 + 0.19 \times D - 1.32 \quad \text{(Formula 5)}$$

$$T\min = -0.0003 \times D^2 + 0.0017 \times D - 0.0024 \quad \text{(Formula 6)}$$

4) In a case where the frequency of the absorption electric waves is not less than 200 GHz and not more than 414 GHZ, the value of a reduction rate T of the thickness of the dielectric layer from the reference thickness dst is a value between a curve represented by (Formula 7)

below and a curve represented by (Formula 8) below with respect to the permittivity D of the dielectric layer, and deviation of a maximum absorption frequency of the electric waves that are to actually be absorbed by the electric-wave absorber from the frequency of the absorption electric waves is within ±5%

$$T\max = -0.0060 \times D^2 + 0.099 \times D - 1.13 \quad \text{(Formula 7)}$$

$$T\min = -0.0001 \times D^2 + 8 \times 10^{-5} \times D - 0.017 \quad \text{(Formula 8)}.$$

2. The electric-wave absorber according to claim 1, wherein a return loss for electric waves with the absorption frequency is 10 dB or more.

3. The electric-wave absorber according to claim 1, wherein the electric resistance film is constituted by a conductive organic polymer film.

4. The electric-wave absorber according to claim 1, wherein the electric resistance film contains at least one of carbon microcoils, carbon nanotubes, and graphene.

5. The electric-wave absorber according to claim 1, wherein the protective layer, the electric resistance film, and the dielectric layer are all made of members with light transmittance, the electric-wave shielding layer is made of a metal mesh, and an overall light transmission rate of the electric-wave absorber is 30% or more.

6. The electric-wave absorber according to claim 1, further comprising an adhesive layer on a back surface of the electric-wave shielding layer.

7. The electric-wave absorber according to claim 1, wherein the protective layer, the electric resistance film, the dielectric layer, and the electric-wave shielding layer are all produced in the form of thin films, and are formed into a flexible sheet as a whole.

8. A manufacturing method for an electric-wave absorber of an electric-wave interference type that absorbs electric waves in a high frequency band in or above a millimeter-wave band, and in which an electric resistance film, a dielectric layer, and an electric-wave shielding layer are sequentially stacked, the method comprising providing a protective layer having a permittivity of 2 or more and 20 or less and a thickness of 10 μm or more and 150 μm or less on the electric resistance film, wherein the dielectric layer has a permittivity D of 2 or more and 8 or less, and a thickness of the dielectric layer is set smaller than a reference thickness dst obtained according to the frequency of the absorption electric waves and the permittivity of the dielectric layer.

* * * * *